United States Patent
DiMeo, Jr. et al.

(10) Patent No.: US 7,819,981 B2
(45) Date of Patent: Oct. 26, 2010

(54) METHODS FOR CLEANING ION IMPLANTER COMPONENTS

(75) Inventors: Frank DiMeo, Jr., Danbury, CT (US); James Dietz, Scarsdale, NY (US); W. Karl Olander, Indian Shores, FL (US); Robert Kaim, Brookline, MA (US); Steven E. Bishop, Rio Rancho, NM (US); Jeffrey W. Neuner, Bethel, CT (US); Jose I. Arno, Brookfield, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 1139 days.

(21) Appl. No.: 10/973,673

(22) Filed: Oct. 26, 2004

(65) Prior Publication Data

US 2006/0086376 A1  Apr. 27, 2006

(51) Int. Cl.
*B08B 6/00* (2006.01)
(52) U.S. Cl. .................................. 134/1.2; 134/1.1
(58) Field of Classification Search .............. 134/22.18, 134/22.1, 22.16, 1, 1.1, 1.2
See application file for complete search history.

(56) References Cited

U.S. PATENT DOCUMENTS

| | | |
|---|---|---|
| 5,144,147 A | 9/1992 | Shiozaki et al. |
| 5,370,568 A | 12/1994 | Ivins et al. |
| 5,413,670 A | 5/1995 | Langan et al. |
| 5,421,957 A | 6/1995 | Carlson et al. |
| 5,554,845 A | 9/1996 | Russell |
| 5,554,854 A | 9/1996 | Blake |
| 5,565,038 A * | 10/1996 | Ashley .................. 134/2 |
| 5,620,526 A | 4/1997 | Watatani et al. |
| 5,633,506 A | 5/1997 | Blake |
| 5,767,021 A | 6/1998 | Imai et al. |
| 5,940,724 A | 8/1999 | Warren |
| 5,943,594 A | 8/1999 | Bailey et al. |
| 5,977,552 A | 11/1999 | Foad |
| 5,988,187 A | 11/1999 | Trussell et al. |

(Continued)

FOREIGN PATENT DOCUMENTS

EP    0 945 892 A2    9/1999

(Continued)

OTHER PUBLICATIONS

S.R. Walther, B.O. Pedersen and C.M. McKenn, Ion Sources For Commercial Ion Implanter Applications, 1991, IEEE.*

(Continued)

*Primary Examiner*—Michael Kornakov
*Assistant Examiner*—Stephen Ko
(74) *Attorney, Agent, or Firm*—Steven J. Hultquist; Intellectual Property/Technology Law; Chih-Sheng Lin

(57) ABSTRACT

A method and apparatus for cleaning residue from components of an ion source region of an ion implanter used in the fabrication of microelectronic devices. To effectively remove residue, the components are contacted with a gas-phase reactive halide composition for sufficient time and under sufficient conditions to at least partially remove the residue. The gas-phase reactive halide composition is chosen to react selectively with the residue, while not reacting with the components of the ion source region or the vacuum chamber.

39 Claims, 5 Drawing Sheets

U.S. PATENT DOCUMENTS

| | | | |
|---|---|---|---|
| 6,033,973 A * | 3/2000 | Takemura | 438/514 |
| 6,135,128 A | 10/2000 | Graf et al. | |
| 6,143,191 A | 11/2000 | Baum et al. | |
| 6,221,169 B1 | 4/2001 | Bernstein et al. | |
| 6,224,785 B1 | 5/2001 | Wojtczak et al. | |
| 6,254,792 B1 | 7/2001 | Van Buskirk et al. | |
| 6,259,105 B1 * | 7/2001 | Eddy et al. | 250/492.21 |
| 6,267,909 B1 | 7/2001 | Currie et al. | |
| 6,290,864 B1 * | 9/2001 | Patel et al. | 216/79 |
| 6,306,807 B1 | 10/2001 | Wojtczak et al. | |
| 6,322,600 B1 | 11/2001 | Brewer et al. | |
| 6,322,756 B1 | 11/2001 | Arno et al. | |
| 6,344,432 B1 | 2/2002 | Wojtczak et al. | |
| 6,355,933 B1 | 3/2002 | Tripsas et al. | |
| 6,379,575 B1 | 4/2002 | Yin et al. | |
| 6,559,462 B1 | 5/2003 | Carpenter et al. | |
| 6,566,315 B2 | 5/2003 | Wojtczak et al. | |
| 6,620,256 B1 * | 9/2003 | Arno et al. | 134/2 |
| 6,620,258 B1 | 9/2003 | Arno et al. | |
| 6,699,399 B1 | 3/2004 | Qian et al. | |
| 6,709,610 B2 | 3/2004 | Van Buskirk et al. | |
| 6,756,600 B2 | 6/2004 | Ng et al. | |
| 6,767,836 B2 | 7/2004 | San et al. | |
| 6,812,648 B2 | 11/2004 | Luten et al. | |
| 6,841,141 B2 | 1/2005 | Arno et al. | |
| 6,843,258 B2 | 1/2005 | Shang et al. | |
| 6,843,858 B2 | 1/2005 | Rossman | |
| 6,846,424 B2 | 1/2005 | Baum et al. | |
| 6,851,432 B2 | 2/2005 | Naghshineh et al. | |
| 6,880,561 B2 | 4/2005 | Goto et al. | |
| 6,887,337 B2 | 5/2005 | Lebouitz et al. | |
| 6,902,629 B2 | 6/2005 | Zheng et al. | |
| 6,921,062 B2 | 7/2005 | Gregg et al. | |
| 7,037,376 B2 | 5/2006 | Harvey et al. | |
| 7,037,813 B2 | 5/2006 | Collins et al. | |
| 7,080,545 B2 | 7/2006 | Dimeo, Jr. et al. | |
| 7,168,436 B2 | 1/2007 | Mouri et al. | |
| 7,201,174 B2 | 4/2007 | Fukiage | |
| 7,201,807 B2 | 4/2007 | Yim et al. | |
| 7,228,724 B2 | 6/2007 | Chen et al. | |
| 7,288,491 B2 | 10/2007 | Collins et al. | |
| 7,296,458 B2 | 11/2007 | Dimeo, Jr. et al. | |
| 7,296,460 B2 | 11/2007 | Dimeo, Jr. et al. | |
| 7,300,038 B2 | 11/2007 | Gregg et al. | |
| 7,487,956 B2 | 2/2009 | Gregg et al. | |
| 7,556,244 B2 | 7/2009 | Gregg et al. | |
| 2002/0011463 A1 * | 1/2002 | Buskirk et al. | 216/64 |
| 2002/0033229 A1 | 3/2002 | Lebouitz et al. | 156/345 |
| 2002/0083961 A1 * | 7/2002 | Tsuga | 134/1.3 |
| 2003/0098038 A1 | 5/2003 | Siegele et al. | |
| 2003/0183244 A1 | 10/2003 | Rossman | |
| 2004/0006249 A1 | 1/2004 | Hoshino et al. | |
| 2004/0108296 A1 * | 6/2004 | Kanayama et al. | 216/2 |
| 2005/0016838 A1 | 1/2005 | Murata et al. | |
| 2005/0230046 A1 | 10/2005 | Lebouitz et al. | |
| 2005/0252529 A1 | 11/2005 | Ridgeway et al. | |
| 2005/0260354 A1 | 11/2005 | Singh et al. | |
| 2006/0005856 A1 | 1/2006 | Sun et al. | |
| 2006/0019039 A1 | 1/2006 | Hanawa et al. | |
| 2006/0086376 A1 | 4/2006 | Dimeo, Jr. et al. | |
| 2006/0169915 A1 | 8/2006 | Olson et al. | |
| 2006/0272775 A1 | 12/2006 | Horsky et al. | |
| 2006/0272776 A1 | 12/2006 | Horsky et al. | |
| 2007/0108395 A1 | 5/2007 | Horsky et al. | |
| 2007/0117396 A1 | 5/2007 | Wu et al. | |
| 2007/0210260 A1 | 9/2007 | Horsky et al. | |
| 2007/0241689 A1 | 10/2007 | Horsky et al. | |
| 2007/0259111 A1 | 11/2007 | Singh et al. | |
| 2008/0121811 A1 | 5/2008 | Horsky et al. | |
| 2008/0142039 A1 | 6/2008 | Chen et al. | |
| 2008/0191153 A1 | 8/2008 | Marganski et al. | |
| 2008/0223409 A1 | 9/2008 | Horsky et al. | |
| 2009/0095713 A1 | 4/2009 | Dimeo, Jr. et al. | |
| 2010/0022095 A1 | 1/2010 | Wu et al. | |

FOREIGN PATENT DOCUMENTS

| | | | |
|---|---|---|---|
| GB | 2412488 | | 9/2005 |
| JP | 08-055804 | A | 2/1996 |
| JP | 2000222724 | A | 8/2000 |
| WO | WO 02/50883 | * | 6/2002 |
| WO | WO 2005/059942 | A2 | 6/2005 |
| WO | WO 2005/072252 | A2 | 8/2005 |
| WO | 2009102762 | A2 | 8/2009 |

OTHER PUBLICATIONS

Williams, K.R., et al., *J. Microelectromechanical Systems*, 5(4), 256-269 (1996).
Winters, H.F., et al., *Appl. Phys. Lett.*, 34(1), 70-73 (1979).
Vugts, M.J.M., et al., *J. Vac. Sci. Technol. A*, 14(5), 2766-2774 (1996).
Bartlett, N., *Proc. of the Chem. Soc.*, 218 (1962).
Chang, F.I., et al., *Proceedings of SPIE*, 2641, 117-128 (1995).
Chernick, C.L., et al., *Science*, 138, 136-138 (1962).
Arnó J. et al., "Fluorine Gas: Safe Packaging and Application of a Non-Global Warming Gas for Semiconductor Materials Processing", *Micromagazine*, 6 pages, (2000).
Arnó J. et al., "Safe Fluorine Gas Source for Semiconductor Materials Processing", *Electrochemical Society Proceedings*, vol. 2001-6, pp. 48-58 (2001).
Co-pending U.S. Appl. No. 12/438,502.
Co-pending U.S. Appl. No. 12/358,723.
Co-pending U.S. Appl. No. 12/298,727.

* cited by examiner

METHODS FOR CLEANING ION IMPLANTER COMPONENTS

FIELD OF THE INVENTION

The present invention relates to a method and apparatus for cleaning the ion source region of an ion implantation system used in the fabrication of a microelectronic device. Specifically, the present invention relates to the in situ removal of residue from the vacuum chamber and components contained therein by contacting the vacuum chamber and/or components with a gas-phase reactive halide composition, e.g., $XeF_2$, for sufficient time and under sufficient conditions to at least partially remove the residue from the components, and to do so in such a manner that residue is removed selectively with respect to the materials from which the components of the ion implanter are constructed.

DESCRIPTION OF THE RELATED ART

Ion implantation is used in integrated circuit fabrication to accurately introduce controlled amounts of dopant impurities into semiconductor wafers and is a crucial process in microelectronic/semiconductor manufacturing. In such implantation systems, an ion source ionizes a desired dopant element gas and the ions are extracted from the source in the form of an ion beam of desired energy. Extraction is achieved by applying a high voltage across suitably shaped extraction electrodes, which incorporate apertures for passage of the extracted beam. The ion beam is then directed at the surface of the workpiece, such as a semiconductor wafer, in order to implant the workpiece with the dopant element. The ions of the beam penetrate the surface of the workpiece to form a region of desired conductivity.

Several types of ion sources are commonly used in commercial ion implantation systems, including the Freeman and Bernas types using thermoelectrodes and powered by an electric arc, a microwave type using a magnetron, indirectly heated cathode sources, and RF plasma sources, all of which typically operate in a vacuum. The ion source generates ions by introducing electrons into a vacuum chamber filled with the dopant gas (commonly referred to as the "feedstock gas"). Collisions of the electrons with dopant atoms and molecules in the gas results in the creation of an ionized plasma consisting of positive and negative dopant ions. An extraction electrode with a negative or positive bias will respectively allow the positive or negative ions to pass through the aperture and out of the ion source as a collimated ion beam, which is accelerated towards the workpiece. Feedstock gases include, but are not limited to, $BF_3$, $B_{10}H_{14}$, $B_{12}H_{22}$, $PH_3$, $AsH_3$, $PF_5$, $AsF_5$, $H_2Se$, $N_2$, $Ar$, $GeF_4$, $SiF_4$, $O_2$, $H_2$, and $GeH_4$.

Presently, there are upwards of 10-15 implantation steps in the fabrication of state of the art devices. Increasing wafer sizes, decreasing critical dimensions, and growing circuit complexity are placing greater demands on ion implant tools, with respect to better process control, the deliverance of high beam currents at low energies, and a decrease in the mean time between failures (MTBF).

The parts of the ion implanter tool that require the most maintenance include: the ion source, which must be serviced after approximately 100 hours of operation, depending on its operating conditions; the extraction electrodes and the high voltage insulator, which usually require cleaning after a few hundred hours of operation. In the ideal case, all feedstock molecules would be ionized and extracted, but in reality a certain amount of feedstock decomposition occurs, which results in the deposition on and contamination of the ion source region. For example, boron residue readily deposits on surfaces in the ion source region. The residue can form on low voltage insulators in the ion source, causing electrical short circuits, which can interrupt the arc required to produce thermionic electrons. This phenomenon is generally known as "source glitching," and it is a major contributor to ion beam instability, and may eventually cause premature failure of the source. The residue also forms on the high voltage components of the ion implanter, such as the source insulator or the surfaces of the extraction electrodes, causing energetic high voltage sparking. Such sparks are another contributor to beam instability, and the energy released by these sparks can damage sensitive electronic components, leading to increased equipment failures and poor MTBF. While the ion source life expectancy for ion implantation systems using non halide-containing source materials is generally around 168 hours, with halide-containing materials such as $GeF_4$, the ion source life can be as low as 10 hours due to the detrimental effects of residue deposition on source operation.

In addition to the operational difficulties caused by residues in the ion implanter, there are also significant personnel safety issues due to the emission of toxic or corrosive vapors when components are removed for cleaning. The safety issues arise wherever residues are present, but are of particular concern in the ion source region because the ion source is the most frequently maintained component of the ion implanter. To minimize down time, contaminated ion sources are often removed from the implanter at temperatures significantly above room temperature, which increases the emission of vapors and exacerbates the safety issue.

It would therefore be a significant advance in the art of ion implantation to provide an in situ cleaning process for the effective, selective removal of unwanted residues deposited throughout the implanter, particularly in the ion source region, during implantation. Such in situ cleaning would enhance personnel safety and contribute to stable, uninterrupted operation of the implantation equipment.

An alternative to in situ cleaning is to provide a separate cleaning station whereby contaminated components that have been removed from the implanter can be cleaned safely without any mechanical abrasion which might damage delicate components such as graphite electrodes. It would therefore also be a significant advance in the art of ion implantation to provide an off-line cleaning station that could be used to selectively and non-destructively clean components following removal from the implant system.

SUMMARY OF THE INVENTION

The present invention relates generally to a method and apparatus for cleaning internal components of an ion implantation tool. Specifically, the present invention relates to the in situ cleaning of the ion source region using a gas-phase reactive halide composition, wherein the gas-phase reactive halide composition is contacted with the residue in the ion source region for sufficient time and under sufficient conditions to at least partially remove the residue from all components in the ion source region.

In one aspect, the present invention relates to a method of cleaning at least one component of a semiconductor manufacturing tool, said method comprising:
(a) introducing an etchant gas from an etchant container into a vacuum chamber of the semiconductor manufacturing tool;
(b) terminating introduction of the etchant gas into the vacuum chamber upon attainment of a predetermined pressure in the vacuum chamber; and (c) reacting the etchant gas with a residue in the vacuum chamber for a sufficient time to at least partially remove the residue from the interior of the vacuum chamber or at least one component contained therein;

wherein the etchant gas is chosen to react selectively with the residue in the vacuum chamber, while being essentially non-reactive with the interior of the vacuum chamber or the components contained therein.

In another aspect, the present invention relates to a method of cleaning an ion source region of a semiconductor manufacturing tool, said method comprising:

(a) introducing an etchant material from an etchant container into a vacuum chamber of the ion source region;

(b) terminating introduction of the etchant gas into the vacuum chamber upon attainment of a predetermined pressure;

(c) dissociating the etchant material into a reactive halide species in the vacuum chamber using a plasma means positioned in said vacuum chamber; and (d) reacting the reactive halide species with a residue in the vacuum chamber for a sufficient time to at least partially remove the residue from the vacuum chamber.

In yet another aspect, the present invention relates to an apparatus for cleaning a vacuum chamber of an ion source region of a semiconductor manufacturing tool, said apparatus comprising:

(a) an etchant material source having an etchant material disposed therein, wherein the etchant material source is communicatively connected to, and is situated upstream of, the vacuum chamber; and (b) a valve between the etchant material source and the vacuum chamber;

wherein said apparatus is further characterized by comprising at least one of the following components (I) and (II):

(I) a heating means for the etchant material source; and (II) an inert gas source having an inert gas disposed therein, wherein the inert gas source is communicatively connected to, and is situated upstream of, the etchant material source.

A further aspect of the present invention relates to a method of ex situ cleaning at least one component of a semiconductor manufacturing tool, said method comprising:

(a) positioning the component in an ex situ vacuum chamber;

(b) introducing an etchant gas from an etchant container into the ex situ vacuum chamber;

(c) terminating introduction of the etchant gas into the vacuum chamber upon attainment of a predetermined pressure in the vacuum chamber; and (d) reacting the etchant gas with a residue in the vacuum chamber for a sufficient time to at least partially remove the residue from the at least one component contained therein;

wherein the etchant gas is chosen to react selectively with the residue on the at least one component, while being essentially non-reactive with the interior of the vacuum chamber.

Other aspects, features and embodiments of the invention will be more fully apparent from the ensuing disclosure and appended claims.

[1] is the global replacement of vacuum chamber with vacuum chamber needed? We should pick one or the other

[2] this is ok for $XeF_2$ but not for $NF_3$

Figure 4:
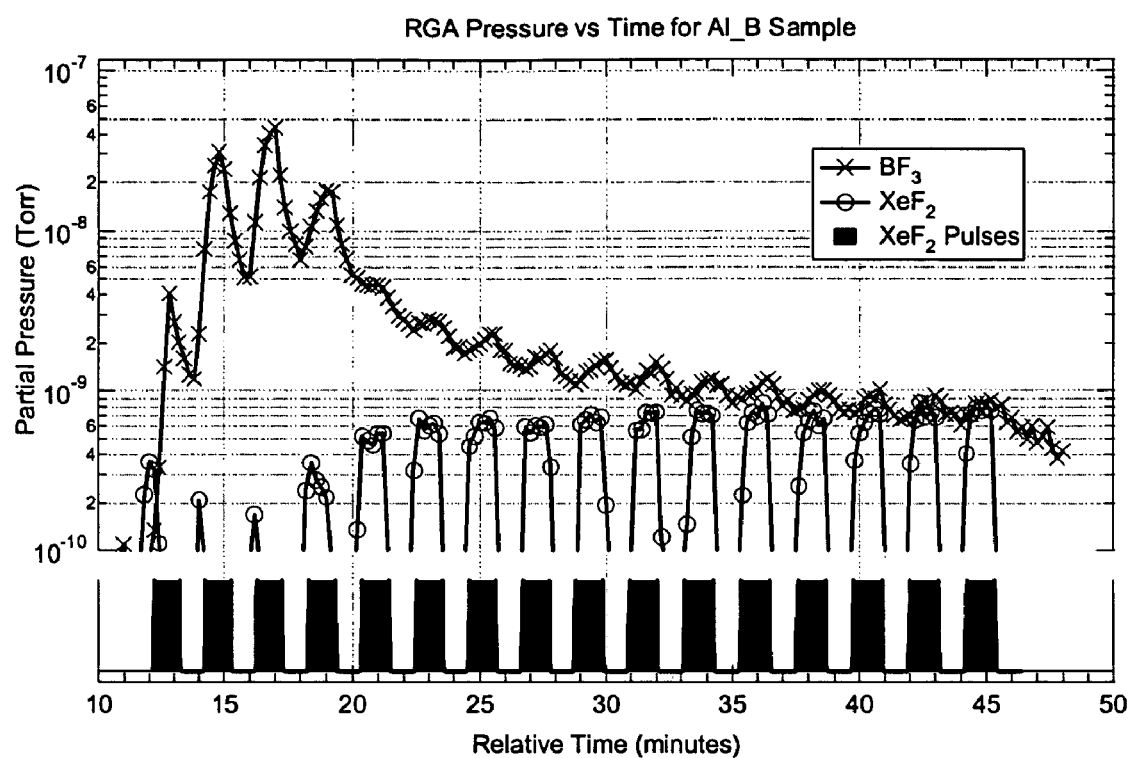

FIG. 4 is an RGA trace as a function of time showing the efficacy of $XeF_2$ in removing boron residue from an aluminum base layer.

Figure 5:
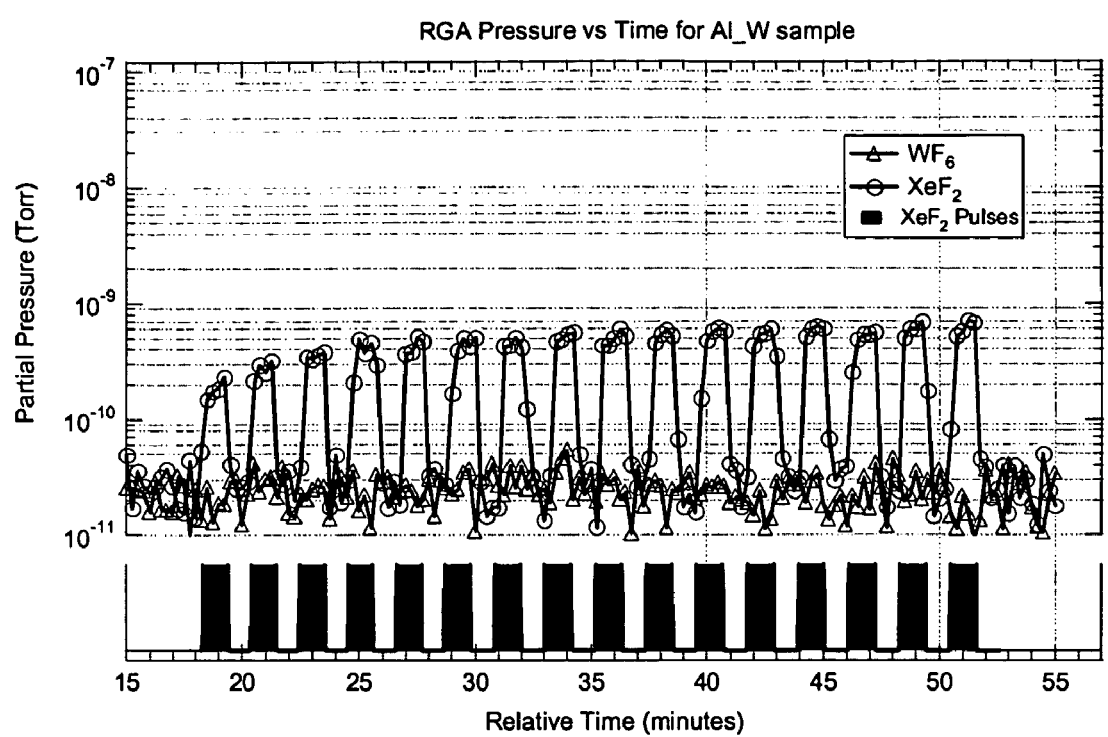

FIG. 5 is an RGA trace as a function of time illustrating that $XeF_2$ does not react with a tungsten layer.

DETAILED DESCRIPTION OF THE INVENTION AND PREFERRED EMBODIMENTS THEREOF

The present invention relates to a method and apparatus for cleaning the ion source region of an ion implantation system used in the fabrication of a microelectronic device. Specifically, the present invention relates to the in situ removal of residue from the vacuum chamber of the ion implanter and components contained therein by contacting the vacuum chamber and/or components with a gas-phase reactive halide composition, e.g., $XeF_2$, $NF_3$, $F_2$, $XeF_6$, $SF_6$, $C_2F_6$, $IF_5$ or $IF_7$, for sufficient time and under sufficient conditions to at least partially remove the residue from the components, and to do so in such a manner that residue is removed selectively with respect to the materials from which the components of the ion implanter are constructed.

As used herein, "ion source region" includes the vacuum chamber, the source arc chamber, the source insulators, the extraction electrodes, the suppression electrodes, the high voltage insulators and the source bushing.

The reactive halide gas may for example include a $XeF_2$ vapor. $XeF_2$ will sublime at room temperature, but may be heated using a heating means to increase the rate of sublimation. $XeF_2$ is known to be an effective silicon etchant and has been used as a silicon selective etchant in Micro Electro Mechanical System (MEMS) device processing because it is extremely selective to $SiO_2$ and other dielectric materials. Specifically, $XeF_2$ reacts with silicon according to the following reaction.

$$2XeF_2(g) + Si(s) \rightarrow 2Xe(g) + SiF_4(g) \quad (1)$$

Importantly, the silicon/$XeF_2$ reaction can occur without activation, i.e., plasma or thermal heating.

In this application, we disclose the use of $XeF_2$ as an etchant for metallic boron. Although not wishing to be bound by theory, it is thought that the boron is etched according to the following reaction.

$$3XeF_2(g) + 2B(s) \rightarrow 3Xe(g) + 2BF_3(g) \quad (2)$$

The use of $XeF_2$ as an etchant for arsenic, phosphorus and germanium has not been reported to the best of our knowledge; however, $XeF_2$ may prove to be an effective etchant for these materials as well according to the following reactions (3) and (4).

$$5XeF_2(g) + 2As(s) \rightarrow 5Xe(g) + 2AsF_5(g) \quad (3)$$

$$5XeF_2(g) + 2P(s) \rightarrow 5Xe(g) + 2PF_5(g) \quad (4)$$

Similar to the silicon/$XeF_2$ reaction, the reactions disclosed herein may occur with or without energetic activation. As used herein, the "residue" may comprise, consist essentially of or consist of silicon, boron, phosphorus, germanium or arsenic.

Importantly, the method and apparatus taught herein is used to at least partially remove the residue from the components of the ion implanter, and to do so in such a manner that residue is removed selectively with respect to the materials from which the components of the ion implanter are constructed, e.g., aluminum, tungsten, etc. As used herein, the term "at least partially remove" is defined as the removal of at least about 25%, more preferably at least about 50%, and most preferably at least about 75% of the residue to be removed.

Several novel ways to deliver the gas-phase reactive halide composition, e.g., a composition including $XeF_2$, to the ion source region for in situ cleaning therein are proposed, including a stagnant mode, a continuous mode, and a direct introduction mode.

Although reference is made hereinafter to a $XeF_2$ composition, other reactive halide compositions may be used including, but not limited to, $XeF_6$, $SF_6$, $C_2F_6$, $IF_5$ or $IF_7$. It is further noted that the $XeF_2$ composition may comprise, consist essentially of or consist of $XeF_2$.

In the stagnant mode, an etchant container with the $XeF_2$ composition disposed therein is communicatively attached to the chamber of the ion implanter to be cleaned, wherein the etchant container and the chamber to be cleaned have a valve disposed therebetween. During cleaning, the valve may be manually or remotely opened whereby the $XeF_2$ vapor is permitted to fill the chamber to be cleaned until a pre-determined pressure is attained. The etchant container may be moderately heated to increase the sublimation rate and/or the sublimation pressure.

In a more preferred embodiment, the cleaning apparatus includes a separate holding chamber of sufficient volume positioned between the etchant container and vacuum chamber. The $XeF_2$ may be flowed first into the holding chamber and stored therein until a pre-determined pressure threshold is reached. Such holding chamber serves to allow immediate gas flow to the vacuum chamber on demand and to shorten the "waiting-period" associated with sublimation. The walls of the holding chamber may be heated to permit higher pressure storage while avoiding condensation of $XeF_2$ on interior surfaces of the chamber. The holding chamber may further comprise flow-regulating devices, such as a mass flow controller, to achieve reproducible delivery of $XeF_2$ into the vacuum chamber.

Once the desired pressure in the vacuum chamber has been attained, the vacuum chamber is sealed and the $XeF_2$ permitted to react for sufficient time and under sufficient conditions to at least partially remove the residue from the vacuum chamber and the components contained therein. The vacuum chamber can then be evacuated and the cleaning process repeated as needed. The evacuated gas mixture may be further directed to abatement units including, but not limited to, chemical and/or physical adsorption beds, incinerators, wet scrubbers, or a combination thereof.

The internal pressure, time, and number of repeat cleanings may be readily determined by those of ordinary skill in the art. The nature and extent of the cleaning of the residue may be empirically determined while varying the time and/or contacting conditions (such as temperature, pressure, concentration and partial pressure) of the $XeF_2$ composition to identify the process conditions producing a desired residue removal result. For example, the pressure of the $XeF_2$ composition in the vacuum chamber may be about 0.3 Torr to about 4.0 Torr, preferably about 0.3 Torr to about 0.7 Torr, and the length of cleaning about 1 to about 4 minutes, which may be repeated about two (2) to about ten (10) times. Preferably, the pressure of the $XeF_2$ is about 0.35 Torr and the length of cleaning about 1 minute. Importantly, the pressure in the vacuum chamber during cleaning should be carefully monitored as the pressure will gradually increase as the cleaning reaction proceeds and should plateau when the reaction has run its course.

Figure 3:
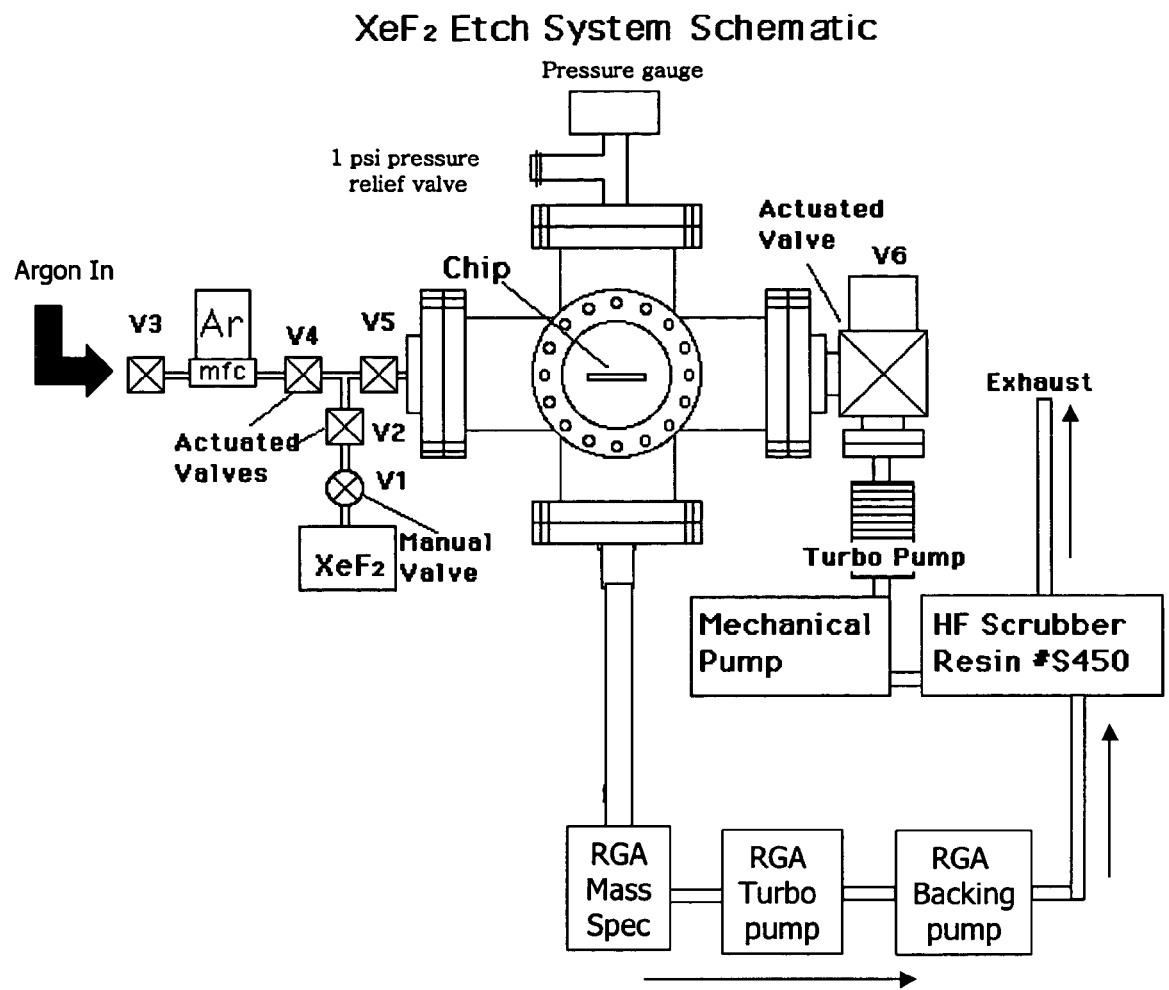
FIG. 3 is a schematic diagram of a 300 amu residual gas analyzer, used to monitor by-products of the residue removal reactions.

A residual gas analyzer may be used to measure the concentration of $XeF_2$ and other reaction byproducts, which may also be useful for monitoring the progress of the cleaning process. A residual gas analyzer (RGA), as shown schematically in FIG. 3, may be attached to the vacuum chamber and used to monitor the by-products of the residue removal reactions. The RGA may be a 200 amu or 300 amu analyzer, most preferably a 300 amu analyzer.

Preferably, the $XeF_2$ gas is generated without energetic activation, although activation is contemplated herein. Thus, effective cleaning can be performed at room temperature, although cleaning is contemplated at temperature in a range of about 0° C. to about 1000° C. depending on the circumstances.

Importantly, the process parameters are chosen to ensure that the reactive halide gas is essentially non-reactive with the ion source region components material of construction. As used herein, "essentially non-reactive" corresponds to less than about 5% of the total reactive halide gas reacts with the components of the ion source region, preferably less than about 2%, most preferably less than about 1%.

Figure 1:
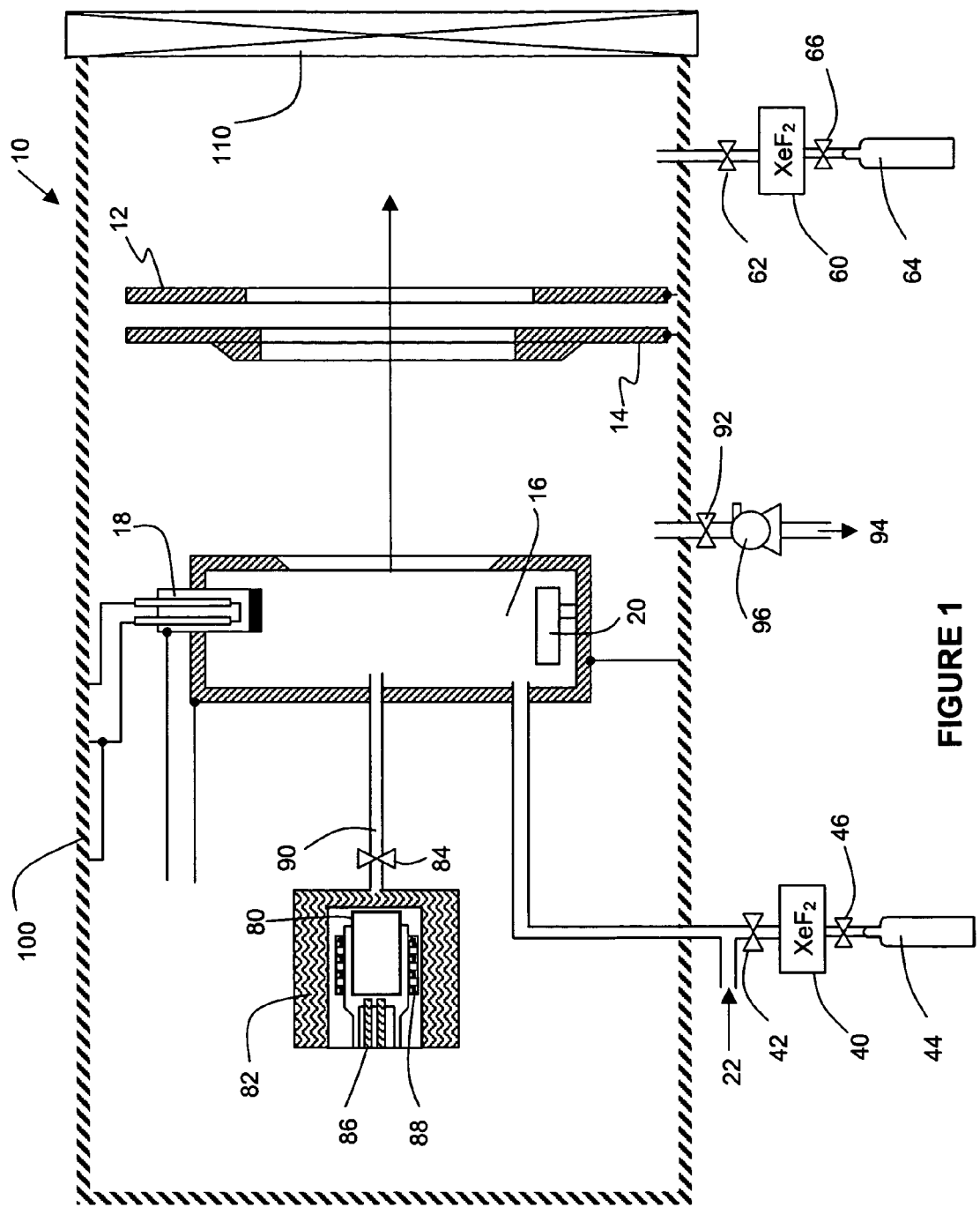
FIG. 1 is a schematic of an indirectly heated cathode ion source, illustrating three optional placements for the etchant material.

An example of the stagnant mode for cleaning an ion source region 10 is shown in FIG. 1, which includes a vacuum chamber 100, an arc chamber 16, the acceleration electrode 14, the deceleration electrode 12, the cathode 18, the anti-cathode 20 and the gate valve 102. The etchant container 80 holding the $XeF_2$ may be communicatively connected to the arc chamber 16 by the dedicated vapor feed line 90 (as shown) or alternatively, although not shown in FIG. 1, the etchant container 80 may be communicatively connected to the vacuum chamber 100. To introduce the $XeF_2$ gas into the arc chamber 16, valve 84 is manually or automatically opened to permit the $XeF_2$ to flow from the etchant container 80 to the arc chamber 16. Alternatively, although not shown in FIG. 1, the $XeF_2$ from an etchant container such as 80, may be introduced into the arc chamber via a reactive gas inlet line (e.g., component 22) instead of a dedicated $XeF_2$ inlet line. Sublimation of the $XeF_2$ source may be assisted by heating the etchant container 80 using a heating means including, but not limited to, heater wires 88, or an oven. The entire etchant container housing 82 may be water cooled. Although not illustrated in FIG. 1, a holding chamber may be situated between the etchant container and the vacuum or arc chamber. Following at least partial removal of the residue from the interior of the chamber to be cleaned, valve 92 is opened and the gases are evacuated using pump 96 via outlet line 94.

In the continuous mode, an etchant container with the $XeF_2$ composition disposed therein is directly or indirectly communicatively attached to the vacuum chamber or to the arc chamber, whereby the etchant container and the chambers to be cleaned has at least one valve disposed therebetween. An inert carrier gas may be arranged to flow continuously over the $XeF_2$ composition in the etchant container to deliver a steady stream of $XeF_2$ to the chamber to be cleaned. The flow rate of the carrier gas, temperature of the etchant container, and cleaning time are experimental parameters readily determined by those skilled in the art. Similar to the stagnant mode, a holding chamber may be situated between the etchant container and the chamber to be cleaned.

An example of the continuous mode, wherein the etchant container is communicatively connected to the arc chamber, is shown in FIG. 1. The etchant container 40 holding the $XeF_2$ composition is communicatively connected to the gas inlet line 22 via the valve 42. Outlet valve 92, pump 96 and outlet line 94 are positioned to withdraw gases from the vacuum chamber 100. When inert gas container 44, valve 46, valve 42 and valve 92 are open, and pump 96 is operating, inert gas flows continuously over the $XeF_2$ composition in the etchant container 40 and the mixture is introduced into the arc chamber 16 via the gas inlet line 22. The gases egress out of the chamber via outlet line 94. Alternatively, the $XeF_2$/inert gas mixture may be introduced into the arc chamber via a dedicated $XeF_2$ vapor feed line (i.e., analogous to component 90). Inert gases contemplated herein include, but are not limited to, argon, nitrogen, xenon, and helium. A further alternative includes sublimation assistance by heating the etchant container 40 using heating means, as described previously with regards to the stagnant mode. In addition, FIG. 1 illustrates the direct introduction of the $XeF_2$ composition into the vacuum chamber 100. In this embodiment, $XeF_2$ from etchant container 60 is communicatively connected to the vacuum chamber 100 via a dedicated inlet line. When inert gas container 64, valve 66, valve 62 and valve 92 are open, and pump 96 is operating, inert gas flows continuously over the $XeF_2$ composition in the etchant container 60 and the mixture is introduced into the vacuum chamber 100 via the dedicated inlet line.

In the direct introduction mode, an etchant container with pre-measured amounts of $XeF_2$ composition, e.g., in the form of pellets, is introduced into the sealed vacuum chamber 100. The $XeF_2$ completely sublimates in the vacuum chamber and the $XeF_2$ is permitted to react for sufficient time and under sufficient conditions to at least partially remove the residue from the ion source region components. The amount of etchant and the time required for cleaning are readily determined by those skilled in the art. Methods for mechanical dispensing, i.e., etchant containers, are readily engineered by those skilled in the art. Following at least partial removal of the residue from the interior of the chamber to be cleaned, valve 92 is opened and the gases are evacuated using pump 96 via outlet line 94. Direct introduction cleaning may be repeated as necessary.

In another embodiment of the invention, the reactive halide gas may for example comprise a nitrogen trifluoride ($NF_3$) vapor. $NF_3$ is used in the semiconductor industry as a fluorine source for plasma etching, e.g., in situ chamber cleaning of CVD reactors. Additional applications include etching of polysilicon, silicon nitride, tungsten silicide and tungsten films. Specifically, $NF_3$ dissociates into reactive halide species in the plasma, such as fluorine radicals and/or fluoride ions, said reactive halide species subsequently reacting with the residue to be removed. For example, if the residue includes boron, cleaning occurs according to the following reaction.

$$3F_2(g) + 2B(s) \rightarrow 2BF_3(g) \qquad (5)$$

Several novel ways to deliver the $NF_3$ compound to the ion source region for in situ cleaning therein are proposed, including a direct dissociative plasma configuration.

Figure 2:
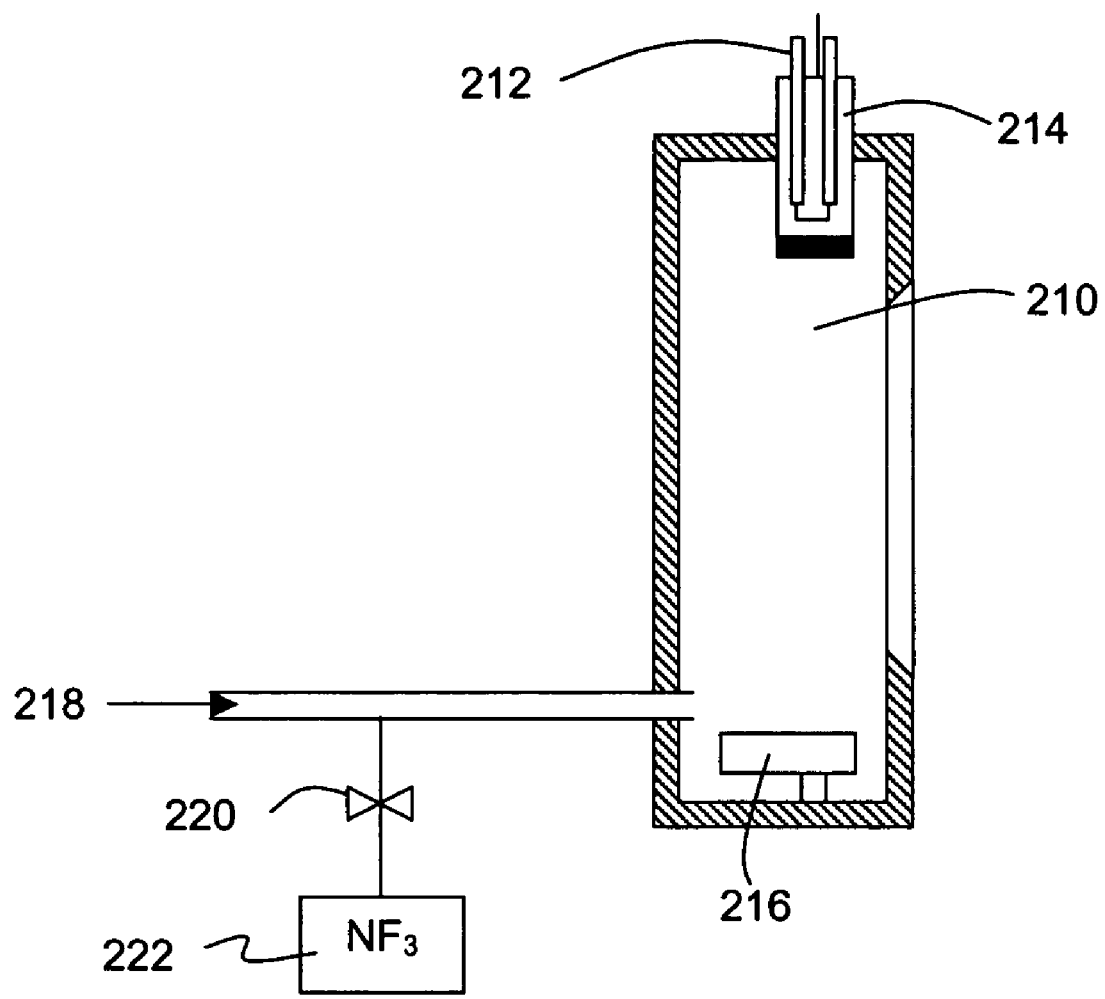
FIG. 2 is a schematic of the direct dissociative plasma configuration described herein.

In the direct dissociative plasma configuration, a $NF_3$ source 222 is communicatively connected to the arc chamber 210, with a valve situated therebetween 220 (see FIG. 2). As seen in FIG. 2, the $NF_3$ source is communicatively connected with the reactive gas, e.g., $BF_3$, inlet tube 218, allowing introduction of $NF_3$ simultaneously with other ion source dopant materials. However, other means of introducing $NF_3$ into the arc chamber are contemplated, for example via a dedicated $NF_3$ inlet line. During cleaning, $NF_3$ enters the arc chamber 210 and the fluoride ions are generated using the existing plasma equipment (e.g., the filament 212, cathode 214 and the anticathode 216) or some additional electronic means arranged within the arc chamber 210. Diluent gases may be added to the arc chamber to dilute the highly reactive fluoride ions. Parameters such as $NF_3$ flow rate into the arc chamber, amount of diluent gas, chamber pressure and time required for cleaning are readily determined by those skilled in the art. Multiple pressures and flow rates are also contemplated, wherein the different pressures and flow rates are used sequentially to effect different plasma shapes and consequently different concentration profiles. Different profiles may be useful for cleaning different areas of the arc chamber, i.e., outer corners, etc. Following at least partial removal of the residue from the interior of the chamber, the gases are evacuated via an outlet line and optionally abated.

Additional cleaning gases contemplated for introduction using the direct dissociative plasma introduction mode, in addition to $NF_3$, include $XeF_2$, $XeF_6$, $IF_5$, $IF_7$, $SF_6$ and $C_2F_6$.

In another embodiment of the invention, the reactive halide gas is fluorine, for example as delivered from Advanced Technology Materials VAC cylinder (Danbury, Conn., USA). Fluorine is an extremely corrosive gas and can be used with or without thermal or electrical activation. Without activation, the fluorine gas can be admitted directly to the ion source region, wherein the gas is permitted to spontaneously react for sufficient time and under sufficient conditions to at least partially remove the residue. If additional activation is required, components may be heated or left at an elevated temperature and the gas permitted to react for sufficient time to at least partially remove the residue. In the alternative, a plasma may be generated within the arc chamber (as described previously) to further induce fluorine activation.

The embodiments described herein may be added directly to newly manufactured ion implantation tools or in the alternative, implanters already in use may be easily retrofitted with the cleaning systems described herein.

In a further embodiment, the etchant gas may be blended with the implanting species, e.g., boron trifluoride, so that etching and implanting may occur simultaneously, which is cost effective in terms of minimization of down time and elimination of additional expensive delivery systems.

The advantages of the present invention include, but are not limited to, selective cleaning of unwanted residue in the ion source region of an ion implantation system, the ability to clean the residue without using plasma-induced radicals thereby minimizing damage to the components of the ion source region, and effective cleaning at room temperature. Residue removal from the ion source region using the method introduced herein reduces source glitching and extraction arcing, thereby contributing to more stable operation of the ion implanter. Further, the ion source lifetime and MTBF are increased, with a concomitant decrease in preventative maintenance costs and time.

In situ cleaning of the ion source region should be performed about 1 to 2 times per week, although the number of cleanings may be more or less often depending on how often the ion implanter is used. Typically, the length of the entire cleaning operation is about 1 hour, although the cleaning time may be more or less.

To perform any of the cleaning operations described herein, the ion source is turned off and the source isolation valve is closed prior to introduction of the etchant gas (or the etchant container in the direct introduction mode). Following residue removal, the ion source is restarted and normal ion implanter operations may be resumed.

In yet another embodiment of the invention, off-line (ex situ) cleaning of the components of the ion source region using a vapor phase is disclosed. In this embodiment, components from any part of the ion implanter which are delicate (e.g., graphite-containing components) may be cleaned off-line thereby eliminating exposure to conventional off-line cleaners, such as harsh abrasives or liquids. Off-line cleaning using a vapor phase material is an advance in the art because abrasives can damage the delicate components and liquids which enter the pores of the delicate components during cleaning must be pumped out of the pores during pump down of the ion source region.

In this embodiment, the ion source or any other power supplies are turned off, relevant isolation valves are closed, and the ion source or other vacuum chamber is vented to atmospheric pressure. Preferably, the ion source region is allowed to cool to room temperature before disengagement of the components to be cleaned from the ion source region. The components are removed from the implanter and positioned in a separate, off-line vacuum chamber with a simple pumping system and valves. Etchant gas, for example $XeF_2$, is introduced into the off-line vacuum chamber according to the teachings herein, for sufficient time and under sufficient conditions to at least partially remove the residue from the components. Following each cleaning phase, the toxic by-products are pumped away to abatement units, as previously described, to properly dispose of the toxic vapors. Preferably, the off-line vacuum chamber is a stand alone unit that is able to service numerous ion implanters, e.g., upwards of 10-12, in the fab.

EXAMPLE 1

Test samples were prepared using electron beam deposition of aluminum, boron, tungsten and silicon on glass microscope slides. The aluminum was used as a bottom layer barrier on the glass slide. Some samples were capped with a protective silicon layer while others were left uncapped and allowed to oxidize. The test samples were sequentially placed into an ex situ $XeF_2$ reactor and etched for 16 one-minute pulse-etch cycles at a pressure of 300-400 mTorr at room temperature.

FIG. 4 illustrates the removal, as determined by RGA, of boron from a glass slide having a base layer of 500 nm of aluminum with 500 nm of boron deposited thereon. There was no silicon capping layer therefore the boron could have potentially formed an oxide layer prior to etching. The $XeF_2$ etch process removed most of the boron in about 4 cycles with a concomitant increase in unreacted $XeF_2$, indicating that boron removal was decreasing or had ceased altogether. Importantly, FIG. 4 illustrates that the boron layer was readily removed using the $XeF_2$ system and method taught herein, even if an oxide layer had formed thereon prior to etching.

FIG. 5 illustrates the removal, as determined by RGA, of tungsten from a glass slide having a base layer of 500 nm of aluminum with 150 nm of tungsten deposited thereon. There was no silicon capping layer therefore the tungsten could have potentially formed an oxide layer prior to etching. No tungsten compounds were observed by RGA however, the presence of $XeF_2$ was significant, indicating that no tungsten removal was occurring. Importantly, FIGS. 4 and 5 illustrate that the system and method taught herein selectively removes ion implantation residue, e.g., boron, while being essentially non-reactive with the materials of construction of the ion implanter, e.g., tungsten and aluminum.

While the invention has been described herein with reference to various specific embodiments, it will be appreciated that the invention is not thus limited, and extends to and encompasses various other modifications and embodiments, as will be appreciated by those ordinarily skilled in the art. Accordingly, the invention is intended to be broadly construed and interpreted, in accordance with the ensuing claims.

What is claimed is:

1. A method of increasing operating lifetime of an ion source in an ion implantation system, comprising intermittently, between ionizing dopant feedstock gas, and repetitively, introducing $XeF_2$ to an ion source region of said ion source, at operating conditions of said ion source producing plasma from the introduced $XeF_2$, to effect cleaning of the ion source region of the ion source to remove dopant feedstock gas ionization residues therefrom, and extend operating lifetime of the ion source.

2. The method of claim 1, wherein the ion source comprises an arc chamber with a filament disposed therein.

3. The method of claim 1, wherein said operating conditions of said ion source comprise elevated temperature of up to 1000° C.

4. The method of claim 1, wherein said dopant feedstock gas ionization residues comprise silicon.

5. The method of claim 1, wherein said dopant feedstock gas ionization residues comprise boron.

6. The method of claim 1, wherein said dopant feedstock gas ionization residues comprise phosphorus.

7. The method of claim 1, wherein said dopant feedstock gas ionization residues comprise germanium.

8. The method of claim 1, wherein said dopant feedstock gas ionization residues comprise arsenic.

9. The method of claim 1, wherein said operating conditions of said ion source comprise subatmospheric pressure.

10. The method of claim 9, wherein said subatmospheric pressure is in a range of from 0.3 torr to about 4.0 torr.

11. The method of claim 1, wherein said ion source comprises an indirectly heated cathode source.

12. The method of claim 1, wherein said ion source comprises a Freeman source.

13. The method of claim 1, wherein said ion source comprises a Bernas source.

14. The method of claim 1, wherein said cleaning of the ion source region is conducted for a time of from 0.5 minute to about 5 minutes.

15. The method of claim 1, wherein said $XeF_2$ is introduced to the ion source region of said ion source in a carrier gas.

16. The method of claim 15, wherein said carrier gas comprises an inert gas.

17. The method of claim 16, wherein the inert gas comprises a gas selected from the group consisting of argon, nitrogen, xenon, and helium.

18. The method of claim 1, wherein said $XeF_2$ is introduced to the ion source region of the ion source from a container in a vacuum chamber of the ion implantation system.

19. The method of claim 1, wherein said $XeF_2$ is introduced to the ion source region of the ion source from a container positioned upstream of a vacuum chamber of the ion implantation system.

20. The method of claim 1, wherein said operating conditions of said ion source comprise pressure in a range of from about 0.3 torr to about 0.7 torr.

21. The method of claim 1, wherein said cleaning is conducted for a period of time in a range of from one minute to about one hour, at intervals according to a predetermined cleaning schedule in which the cleaning is carried out multiple times, on a daily or weekly basis.

22. The method of claim 1, wherein said ion source region comprises a vacuum chamber containing said ion source, wherein said $XeF_2$ is introduced to the vacuum chamber from a container, and wherein a valve is disposed between the container and the chamber, and said valve is openable for flow of $XeF_2$ from the container to the vacuum chamber.

23. The method of claim 22, wherein said valve is manually openable.

24. The method of claim 22, wherein said valve is remotely openable.

25. The method of claim 1, wherein the $XeF_2$ introduced to the ion source region of the ion source is generated by sublimation.

26. The method of claim 1, wherein said cleaning is conducted for a time of less than one hour.

27. A method of increasing operating lifetime of an ion source in an ion implantation system of a semiconductor manufacturing facility, comprising intermittently, between ionizing dopant feedstock gas, and repetitively, introducing $XeF_2$ to an ion source region of said ion source, at operating conditions of said ion source producing plasma from the introduced $XeF_2$, to effect cleaning of the ion source region of the ion source to remove dopant feedstock gas ionization residues therefrom, and extend operating lifetime of the ion source, wherein said cleaning is conducted for a period of time in a range of from one minute to about one hour, at intervals according to a predetermined cleaning schedule in which the cleaning is carried out multiple times, on a daily or weekly basis.

28. The method of claim 27, wherein said dopant feedstock gas ionization residues comprise silicon.

29. The method of claim 27, wherein said dopant feedstock gas ionization residues comprise boron.

30. The method of claim 27, wherein said dopant feedstock gas ionization residues comprise phosphorus.

31. The method of claim 27, wherein said dopant feedstock gas ionization residues comprise germanium.

32. The method of claim 27, wherein said dopant feedstock gas ionization residues comprise arsenic.

33. The method of claim 27, wherein said cleaning of the ion source region is conducted for a period of time of from 0.5 minute to about 5 minutes.

34. A method of increasing operating lifetime of an ion source in an ion implantation system, comprising intermittently, between ionizing dopant feedstock gas, and repetitively, introducing $XeF_2$ to an ion source region of said ion source, at operating conditions of said ion source producing plasma from the introduced $XeF_2$, to effect cleaning of the ion source region of the ion source to remove dopant feedstock gas ionization residues therefrom, and extend operating lifetime of the ion source, wherein said $XeF_2$ is introduced to the ion source region of the ion source from a container in a vacuum chamber of the ion implantation system, wherein said cleaning is conducted for a period of time in a range of from one minute to about one hour, at intervals according to a predetermined cleaning schedule in which the cleaning is carried out multiple times, on a daily or weekly basis, and wherein said ionizing dopant feedstock gas and said cleaning of the ion source region of the ion source comprise uninterrupted operation of the ion implantation system.

35. The method of claim 34, wherein said dopant feedstock gas ionization residues comprise silicon.

36. The method of claim 34, wherein said dopant feedstock gas ionization residues comprise boron.

37. The method of claim 34, wherein said dopant feedstock gas ionization residues comprise phosphorus.

38. The method of claim 34, wherein said dopant feedstock gas ionization residues comprise germanium.

39. The method of claim 34, wherein said dopant feedstock gas ionization residues comprise arsenic.

* * * * *